(12) United States Patent
Kim et al.

(10) Patent No.: US 8,715,914 B2
(45) Date of Patent: May 6, 2014

(54) ORGANOMETALLIC COMPOSITION FOR FORMING A METAL ALLOY PATTERN AND A METHOD OF FORMING SUCH A PATTERN USING THE COMPOSITION

(75) Inventors: Jin Young Kim, Gyeonggi-Do (KR); Soon Taik Hwang, Gyeonggi-Do (KR); Young Hun Byun, Daejeon-Shi (KR); Euk Che Hwang, Gyeonggi-Do (KR); Sang Yoon Lee, Seoul (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 152 days.

(21) Appl. No.: 12/929,151

(22) Filed: Jan. 4, 2011

(65) Prior Publication Data

US 2011/0104617 A1    May 5, 2011

Related U.S. Application Data

(62) Division of application No. 10/718,809, filed on Nov. 24, 2003, now Pat. No. 7,883,838.

(30) Foreign Application Priority Data

Nov. 25, 2002  (KR) .................. 2002-73498

(51) Int. Cl.
  *G03C 1/735* (2006.01)
(52) U.S. Cl.
  USPC .............................. 430/322; 430/11; 502/102
(58) Field of Classification Search
  USPC ...................................... 430/11, 322; 502/102
  See application file for complete search history.

(56) References Cited

U.S. PATENT DOCUMENTS

| | | | |
|---|---|---|---|
| 4,577,024 A * | 3/1986 | Fletcher et al. | 546/183 |
| 5,064,685 A | 11/1991 | Kestenbaum et al. | |
| 5,534,312 A | 7/1996 | Hill et al. | |
| 6,184,403 B1 | 2/2001 | Welch et al. | |
| 6,348,239 B1 | 2/2002 | Hill et al. | |
| 6,620,577 B1 | 9/2003 | Lynch et al. | |

FOREIGN PATENT DOCUMENTS

| | | |
|---|---|---|
| JP | 62-263973 | 11/1987 |
| JP | 2001-221908 | 8/2001 |
| JP | 2001-226765 | 8/2001 |

* cited by examiner

*Primary Examiner* — Daborah Chacko Davis
(74) *Attorney, Agent, or Firm* — Harness, Dickey & Pierce, P.L.C.

(57) ABSTRACT

An organometallic composition containing an organometallic compound (I) containing Ag, an organometallic compound (II) containing Au, Pd, or Ru, and an organometallic compound (III) containing Ti, Ta, Cr, Mo, Ru, Ni, Pd, Cu, Au, or Al, wherein the metal components of organometallic compounds (II) and (III), respectively, are present in an amount of 0.01~10 mol % based on the amount of Ag in the organometallic compound (I), and a method of forming a metal alloy pattern using the same. Silver alloy patterns can be obtained through a simplified manufacturing process, which patterns have enhanced heat resistance, adhesiveness, and chemical stability. The method may be applied to making a reflective film for LCD and metal wiring (gate, source, drain electrode) for flexible displays or flat panel displays, and further to CMP-free damascene processing and PR-free ITO film deposition.

11 Claims, No Drawings

1

ORGANOMETALLIC COMPOSITION FOR FORMING A METAL ALLOY PATTERN AND A METHOD OF FORMING SUCH A PATTERN USING THE COMPOSITION

CROSS-REFERENCE TO RELATED APPLICATIONS

This application is a divisional under 35 U.S.C. §121 of U.S. application Ser. No. 10/718,809, filed on Nov. 24, 2003, now U.S. Pat. No. 7,883,838 which claims priority under 35 U.S.C. §119(a) to Korean Application No. 2002-73498, filed on Nov. 25, 2002, the entire contents of each of which are incorporated herein by reference.

TECHNICAL FIELD

The present invention relates to a composition of organometallic compounds and to a method of forming a metal alloy pattern using the same, and more specifically, to a composition of organometallic compounds comprising organometallic compound (I) containing Ag, organometallic compound (II) containing Au, Pd or Ru, and organometallic compound (III) containing Ti, Ta, Cr, Mo, Ru, Ni, Pd, Cu, Au or Al, wherein the metal components of the organometallic compounds (II) and (III), respectively, are present in an amount of 0.01~10 mol % of based on the amount of Ag in the organometallic compound (I). The present invention is also directed to a method of forming a metal alloy pattern using the same.

BACKGROUND

In the production of electronic devices such as integrated circuits or liquid crystal displays, microlithography techniques have been used to form a patterned film of materials such as metal, which have desired electrical properties, on a certain substrate including a crystallized silicon wafer, a glass substrate, and the like. Microlithography comprises several steps including that of: forming a base layer of metallic materials on a substrate through chemical vapor deposition, plasma deposition or electroplating; applying a photoresist layer on the metal layer; exposing the photoresist layer under a photomask to light; developing the photoresist layer to provide a patterned photoresist layer; and etching the metal layer beneath the patterned photoresist layer by, for example, reactive etching to provide the metal wiring of a micro-pattern. Such multiple processes of microlithography, in addition to requiring the use of expensive photoresists and chemical etching material, make it undesirable in the light of cost as well as the protection of the environment. Moreover, many of the processes should be carried out under high temperatures and/or high pressures, and in such condition, diffusion of metallic vapor into the substrate is likely to occur, resulting in a deterioration of the final electronic devices. Recently, in the field of flexible display and TFT-LCD, demand has increased for requiring improved techniques of forming a high quality gate insulating film and a low resistance source/drain electrode area, and accordingly, diversified studies have been made to provide a more simplified method of forming a metal pattern.

For example, Japanese Laid-Open Publication No. 62-263973 discloses a patterning method, wherein an electron beam is irradiated on a thin film of organometallic compounds to form a metal pattern. In this method, an excessive amount of electron beam is necessary and thus mass-production of the metal pattern becomes difficult. Also, there are concerns about nonuniformity of the metal pattern.

In U.S. Pat. No. 5,064,685, an ink-containing organometallic compound is coated on a substrate, and, by exposure to a laser beam, the resulting coat is allowed to undergo thermal degradation to provide a patterned metal film. However, this method has a serious shortcoming in that the substrate should be subjected to high temperature conditions, and therefore a pattern of silver or silver alloy cannot be produced by this process.

On the other hand, U.S. Pat. Nos. 5,534,312 and 6,348,239 describe that a metal pattern can be obtained by coating a substrate with an organometallic complex synthesized by bonding one or more photosensitive organic ligands to one or more metal atoms, and exposing the coating to electromagnetic radiation, wherein any photosensitive resin needs not to be used. When exposed to electromagnetic radiation, the organometallic complex goes through a photochemical reaction, resulting in the dissociation of the organic ligands from the central metal atom. The remaining metal atoms then react with adjacent metal atoms and/or atmospheric oxygen atoms to form an oxidized metal pattern. However, there are several problems with ligand dissociation through photochemical reaction. Typically, the ligand dissociation rate is so low that a large amount of time is required to complete the patterning, and ligand contamination is inevitable. In addition, for improving the reflectivity of the oxidized metal pattern, heat treatment at 200° C. or more under a mixed gas stream of $H_2/N_2$ is required, and such treatment is not applicable to silver and silver alloys.

Thus, there remains a strong demand in the art to develop a method of producing a reflective film of silver or silver alloy under mild conditions while improving heat-resistance, adhesiveness and stability to discoloration caused by atmospheric oxygen.

At the same time, it should be realized that Silver is difficult to use in the production of a patterned film for numerous reasons: Silver is highly reactive with non-metallic elements, so it readily becomes discolored into a black or milky color, for example, by forming $Ag_2S$ or AgCl with sulfur or chloride in the atmosphere. In addition, silver is vulnerable to heat, so, in the case of producing a reflective film for LCD's by the use of silver, the process temperature should be controlled to prevent diffusion of the outer layer of the silver film. A reflective film comprising silver has a further problem in that yellow, reflected light is too strong at short wavelengths (i.e., 450 nm or less), and this yellowing problem gradually becomes severe. Therefore, silver has been seldom regarded as a useful material in the production of LCD's or PDA's.

In order to overcome these shortcomings of silver, Japanese Laid-Open Publication Nos. 01-221908 and 01-226765 disclose silver alloys containing 0.1~3.0 wt % of Pt, Pd, or Rb and 0.1~3.0 wt % of at least one of Cu, Ti, Cr, Ta, Ni, Mo, and Al. These alloys, however, are produced as a film on a substrate by sputtering so that microlithography processing is essential for obtaining a desired pattern, which is problematic in light of the complexity and expenses as described above.

SUMMARY

One of the features of the present invention is to provide a ternary organometallic composition, which includes a first organometallic compound containing Ag, a second organometallic compound containing at least one of Au, Pd, or Ru, and a third organometallic compound containing at least one of Ti, Ta, Cr, Mo, Ru, Ni, Pd, Cu, Au, or Al.

The present invention also defines a method of forming a metal alloy pattern using the ternary organometallic composition.

All of the above features and other features of the present invention will be successfully achieved as described in the following description.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DETAILED DESCRIPTION

The inventive composition of organometallic compounds as defined by the present invention comprises organometallic compound (I) of Formula 1 containing Ag, organometallic compound (II) of Formula 2 containing Au, Pd, or Ru, and organometallic compound (III) of Formula 3 containing Ti, Ta, Cr, Mo, Ru, Ni, Pd, Cu, Au, or Al:

     Formula 1 wherein,

L is a neutral metallic ligand, which contains 1~20 carbon atoms and a donor selected from the group consisting of N, P, O, S, and As;

X is an anion selected from the group consisting of $F^-$, $Cl^-$, $Br^-$, $I^-$, alkoxide, hydroxy, cyano($CN^-$), nitro($NO_2^-$), nitrate($NO_3^-$), nitroxyl, azide, thiocyanate, isothiocyanate, tetraalkylborate, tetrahaloborate, hexafluorophosphate($PF_6^-$), triflate($CF_3SO_3^-$), tosylate($Ts^-$), sulfate ($SO_4^{2-}$), carbonate($CO_3^{2-}$), carboxylate, diketonate, and alkyl anion;

m is an integer from 1 to 10;

n is an integer from 0 to 40, provided that each L is the same or different in the case where n is 2 or higher, and provided that L functions as a ligand connecting Ag atoms in the case where m is 2 or higher;

p is an integer from 0 to 40, provided that each X is the same or different in the case where p is 2 or higher; and both n and p are not zero at the same time.

     Formula 2 wherein,

M' is Au, Pd, or Ru;

L' is a neutral ligand containing 1~20 carbon atoms, which is selected from the group consisting of amine compounds, phosphine compounds, phosphite compounds, phosphineoxide compounds, arsine compounds, thiol compounds, carbonyl compounds, alkenes, alkynes, and arene;

X' is an anion selected from the group consisting of, $F^-$, $Br^-$, $I^-$, alkoxide, hydroxy, cyano($CN^-$), nitro($NO_2^-$), nitrate($NO_3^-$), nitroxyl, azide, thiocyanate, isothiocyanate, tetraalkylborate, tetrahaloborate, hexafluorophosphate($PF_6^-$), triflate($CF_3SO_3^-$), tosylate($Ts^-$), sulfate ($SO_4^{2-}$), carbonate($CO_3^{2-}$), carboxylate, diketonate, and alkyl anion;

m' is an integer from 1 to 10;

n' is an integer from 0 to 40, provided that each L' is the same or different in the case where n' is 2 or higher, and provided that L' functions as a ligand connecting metal atoms in the case where m' is 2 or higher;

p' is an integer from 0 to 40, provided that each X' is the same or different in the case where p' is 2 or higher; and both p' and n' are not zero at the same time; and

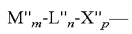     Formula 3 wherein,

M" is Ti, Ta, Cr, Mo, Ru (provided that M' in Formula 2 is not Ru), Ni, Pd (provided that M' in Formula 2 is not Pd), Cu, Au (provided that M' in Formula 2 is not Au) or Al;

L" is a neutral ligand containing 1~20 carbon atoms, which is selected from the group consisting of amine compounds, phosphine compounds, phosphite compounds, phosphineoxide compounds, arsine compounds, thiol compounds, carbonyl compounds, alkenes, alkynes, and arene;

X" is an anion selected from the group consisting of $F^-$, $Cl^-$, $Br^-$, $I^-$, alkoxide, hydroxy, cyano($CN^-$), nitro ($NO_2^-$), nitrate($NO_3^-$), nitroxyl, azide, thiocyanate, isothiocyanate, tetraalkylborate, tetrahaloborate, hexafluorophosphate($PF_6^-$), triflate($CF_3SO_3^-$), tosylate ($Ts^-$), sulfate($SO_4^{2-}$), carbonate($CO_3^{2-}$), carboxylate, diketonate, and alkyl anion;

m" is an integer from 1 to 10;

n" is an integer from 0 to 40, provided that each L" is the same or different in the case where n" is 2 or higher, and provided that L" functions as a ligand connecting metal atoms in the case where m" is 2 or higher; and p" is an integer from 0 to 40, provided that each X" is the same or different in the case where p" is 2 or higher; and both p" and n" are not zero at the same time.

In the organometallic compounds represented by Formulas 1~3, the number of ligand varies according to the kind and oxidation number of the metal atom and it can range from 0 to 6 for every metal atom. The number of anions can also range from 0 to 6 for every metal atom.

In Formulas 1~3, each of L, L' and L" represents a neutral ligand bonded to metal atom(s) and, independently, is selected from the group consisting of amine compounds, phosphine compounds, phosphite compounds, phosphineoxide compounds, arsine compounds, thiol compounds, carbonyl compounds, alkenes, alkynes, and arenes.

In Formulas 1~3, each of X, X' and X" represents an anion which makes the corresponding organometallic compound electrically neutral and may or may not be coordinated to the metal atom(s).

Preferable examples of the organometallic compound of Formula 1 includes, but are not limited to, $Ag(NO_2)(PrNH_2)_n$, $Ag(NO_3)(PrNH_2)_n$, $Ag(NO_2)(BuNH_2)_n$, and $Ag(NO_3)(BuNH_2)_n$. Preferable examples of the organometallic compound of formula 2 includes, but are not limited to, $AuPrNH_2$ (CN), palladium acetate($(CH_3CO_2)_2Pd$), and dicarbonylcyclopentadienyl ruthenium(II)dimmer ($[C_5H_5Ru(CO)_2]_2$). Preferable examples of the organometallic compound of Formula 3 includes, but are not limited to, $AuPrNH_2$ (CN), palladium acetate($(CH_3CO_2)_2Pd$), dicarbonylcyclopentadienyl ruthenium(II)dimmer ($[C_5H_5Ru(CO)_2]_2$), copper(II)2-ethylhexanoate($[CH_3(CH_2)_3CH(C_2H_5)CO_2]_2Cu$), and titanium(IV)isopropoxide ($Ti[OCH(CH_3)_2]_4$).

In the present invention, the metal component (represented by M') of the compound of Formula 2 is different from that (represented by M") of the compound of Formula 3.

In the compound of Formula 1, the organic ligand (represented by L) is so sensitive to light that it becomes readily dissociated from the central metal atom and is decomposed according to Reaction Formula (i) upon exposure to light. Thus it is possible to obtain a patterned metal film without performing the laborious procedure of applying and etching the photoresist film as defined in the prior art.

Reaction Formula (i)

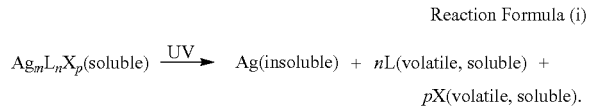

$Ag_mL_nX_p$(soluble) $\xrightarrow{UV}$ Ag(insoluble) + $n$L(volatile, soluble) + $p$X(volatile, soluble).

In the present invention, the organometallic compounds of Formulas 2 and 3 need not have photosensitivity. Probably, it is believed that the organometallic compounds of Formulas 2 and 3, being mixed uniformly in the composition, are captured between the organometallic compound of Formula 1, and then they decompose during a subsequent annealing process or decompose by being deprived of electrons when the Ag-containing compound of Formula 1 is reduced upon irradiation. Therefore, in the inventive ternary composition of organometallic compounds, the amount of the compounds of Formulas 2 and 3 should be determined based on the Ag content of the composition. That is, the compounds of Formulas 2 and 3 are added to the compound of Formula 1 so that metal components provided by the compounds of Formulas 2 and 3, respectively, are present in an amount of 0.01~10 mol %, more preferably 0.05~1 mol % based on the mole amount of Ag provided by the compound of Formula 1. Where the metal component provided by the compound of Formula 2 or 3 exceeds 10 mol %, the results are not satisfactory because the specific resistance increases and the photoreaction velocity decreases. On the other hand, where it is less than 0.01 mol %, there is little improvement in the adhesiveness or chemical stability of the final metal alloy pattern.

A method of forming a metal alloy pattern according to the present invention comprises the steps of: (i) dissolving the inventive composition of organometallic compounds in an organic solvent to produce a coating solution; (ii) coating a substrate with the coating solution to form a coating film; (iii) exposing the coating film to a light source using a photomask having a desired pattern; and (iv) developing the exposed film. As used herein, "metal alloy" is a term that can include not only a substantially pure metal alloy but also an oxide thereof.

In step (i), the organic solvent can be exemplified by, but is not limited to, a nitrile-based solvent such as acetonitrile, propionitrile, pentanenitrile, hexanenitrile, heptanenitrile, and isobutylnitrile; an aliphatic hydrocarbon solvent such as hexane, heptane, octane, and dodecane; an aromatic hydrocarbon solvent such as anisole, mesitylene, and xylene; a ketone-based solvent such as methyl isobutyl ketone, 1-methyl-2-pyrrolidinone, cyclohexanone, and acetone; an ether-based solvent such as tetrahydrofuran, diisobutyl ether, and isopropyl ether; an acetate-based solvent such as ethyl acetate, butyl acetate, and propylene glycol methyl ether acetate; an alcohol-based solvent such as isopropyl alcohol, butyl alcohol, hexyl alcohol, and octyl alcohol; and mixtures thereof.

In step (ii), the substrate can be made of inorganic materials such as silicon and glass; organic materials such as plastic; or composite materials comprising organic and inorganic matter.

In the present invention, coating of the substrate with the coating solution can be accomplished, for example, through spin coating, roll coating, dip coating, spray coating, flow coating or screen printing, while spin coating is most preferred.

In step (iii), the coating film thus formed is exposed to electromagnetic radiation. The light source for the electromagnetic radiation is not particularly limited, but UV light is most preferred.

During the exposure, the compound of Formula 1, in the unmasked portion of the coating film, undergoes a photochemical reaction as described in Reaction Formula (i), resulting in the transformation into a metal alloy or an oxide thereof depending on the atmosphere of the exposure process. More specifically, when the organometallic compound is irradiated, the ligand bonded to the metal atom is dissociated and thus adjacent organometallic compounds become more unstable and consequently are converted into metal or metal oxide depending on the atmosphere. Although it varies with the type of metals and ligand, generally the photochemical reaction of organometallic compounds is as follows: through (a) metal to ligand charge transfer; (b) ligand to metal charge transfer; (c) d-d excite state; or (d) intramolecular charge transfer, whereby the bonds between metals and ligands become unstable and are broken. And as a result of such photochemical reactions, a solubility difference is created between exposed portions and unexposed portions of the coating film.

In step (iv), developing is accomplished either with a solvent used for the preparation of the coating solution in step (i), wherein a single solvent or a mixed solvent can be used according to the desired dissolution rate, or with any solvent typically used in semiconductor processes, such as tetramethylamoniumhydroxide (TMAH). For the purpose of improving clarity of the final pattern, two or more developing solvents can be used alternatively.

In the present invention, the exposure and development steps can be performed in a vacuum or in an atmosphere of air, $O_2$, $H_2$, $N_2$, Ar or a mixed gas thereof. These steps are also performed at room temperature or at a temperature below the thermal decomposition temperature of the organometallic compounds.

After development, the obtained pattern may undergo a chemical reaction such as reduction or oxidation so as to obtain the metal or metal oxide. For obtaining pure metal, reduction is preferred and for obtaining the metal oxide, oxidation is preferred. The reduction or oxidation can be performed in a vacuum or in an atmosphere of air, $O_2$, $H_2$, $N_2$, Ar or a mixed gas thereof. In the reduction step any organic or inorganic reducing agent can be used. Preferable organic reducing agents are exemplified by, but are not limited to, hydrazines, silanes, amines, and derivatives thereof. Preferable inorganic reducing agents can be exemplified by, but are not limited to, metal hydrides such as $NaBH_4$ and $LiAlH_4$. These organic and inorganic reducing agents can be used themselves or as a solution in a proper solvent, and thus the reduction can be performed in gas-phase or liquid-phase. Meanwhile, oxidation can be accomplished by the use of any organic or inorganic oxidant. Non-limiting example's of the organic oxidant include N-oxides such as trimethylamine N-oxide and pyridine N-oxide; peroxides such as bis(trimethylsilyl)peroxide; perbenzoic acid; $O_3$; and $O_2$. Inorganic oxidants such as $H_2O_2$, $H_2SO_4$, and $HNO_3$ can also be used.

The inventive method of forming a metal alloy pattern may further comprise an annealing step if necessary. Annealing is performed at a temperature of 300° C. or lower, preferably 200° C. or lower, in vacuum or in an atmosphere of air, $N_2$ gas or a $N_2/H_2$ mixed gas. In contrast with the prior art, annealing of the coating film can be accomplished at a relatively low temperature of 300° C. or lower, so a desired metal alloy pattern can be formed even on a heat-labile substrate such as glass or a plastic plate.

According to the present invention, multilayer films of metal alloy can be obtained which may be employed in most electronic devices. In multilayer films, each layer can have the same or different metal composition. Such a multilayer film can be obtained by repeating all the steps of the inventive method of forming a metal alloy pattern, including steps (i) through (iii) and, optionally, the additional step of reduction, oxidation and/or annealing as described above.

The inventive method of forming a metal alloy pattern may be applied to making a reflective film for LCD's and metal wiring (gate, source, drain electrode) for flexible displays or flat panel displays, and further to CMP-free damascene processing and PR-free ITO film deposition.

The present invention can be more clearly understood with referring to the following examples. It should be understood that the following examples are not intended to restrict the scope of the present invention in any manner.

Production Examples of Photosensitive Organometallic Coordination Compounds

Synthesis of $Ag(NH_2Pr)_n(NO_2)$ mixture (n=1, 2, 3, and 4)

The synthesis is performed in a $N_2$ atmosphere while excluding atmospheric moisture and oxygen by Schlenk technique or Glove box. In a 50 ml round bottom Schlenk flask, 3.08 g (20.0 mmol) of $AgNO_2$ is dissolved in 15 ml of acetonitrile ($CH_3CN$). To this solution is added 3.69 g (60.9 mmol) of propylamine in drops using a syringe and the resulting solution is stirred at room temperature for 1 hr. Following the stirring, the reaction mixture is filtered through a 0.2 μm membrane filter. With the filtrate shield from light, solvent is completely evaporated under a reduced pressure for 3~4 hrs to afford colorless oil. $^1$H-NMR spectrum is as follows:

$^1$H-NMR ($CD_3OD$, ppm): 4.87 [s, 2H, $H_2N-CH_2$)], 2.77 [t, 2H, $N-CH_2$)], 1.61 [m, 2H, $CH_2CH_3$], 1.02 [t, 3H, $CH_2CH_3$]

Synthesis of $Au(NH_2Pr)_n(CN)$ mixture (n=1, 2, 3, and 4)

To a 50 ml round bottom Schlenk flask are added 1.0 g (4.5 mmol) of AuCN and 15 ml of acetonitrile ($CH_3CN$). To this slurry is added an excessive amount of propylamine in drops using a syringe and stirred at room temperature for 1 hr. Following the stirring, the reaction mixture is filtered through a 0.2 μm membrane filter. With the filtrate shield from light, excessive amine and solvent are completely evaporated under a reduced pressure to afford colorless solid matter.

Example 1

6.42 g(3.0 mol) of $Ag(NH_2Pr)_n(NO_2)$, 0.0013 g(0.0006 mol) of $Au(NH_2Pr)_n(CN)$ (that are produced by production example) and 0.0021 g(0.0006 mol) of copper(II)-ethylhexanoate are dissolved in 5.4 ml of acetonitrile to afford a coating solution. This coating solution is then applied to a glass substrate by spin coating. Under a photomask, the resulting coating film is exposed to light by using Oriel 200 W UV exposure system for 10 minutes. Thereafter, the exposed coating film is developed with acetonitrile to afford a metal alloy pattern. This pattern is reduced by immersing in 0.05M hydrazine solution, and then it is annealed at 200° C. in vacuum for 2 minutes to afford a final metallic reflective film having a certain pattern.

Heat resistance and durability of the reflective film are measured by comparing decrease of reflectivity after pressure-cooking test. In this test, at the wavelengths of 480 nm, 633 nm, and 700 nm, reflectivities of test pieces that had been subjected to high-humidity state at 100° C. for 120 minutes are compared with initial values. The results are shown in Table 1 below.

Example 2

The procedure of Example 2 is conducted according to the same manner as in the above Example 1, except that palladium(II)acetate was used instead of copper(II)2-ethylhexanoate. Heat resistance and durability of the reflective film are shown in Table 1 below.

Example 3

The procedure of Example 3 is conducted according to the same manner as in the above Example 1, except that titanium (IV) isopropoxide is used instead of copper(II)2-ethylhexanoate. Heat resistance and durability of the reflective film are shown in Table 1 below.

Example 4

The procedure of Example 4 is conducted according to the same manner as in the above Example 1, except that palladium(II)acetate is used instead of $AuCN-(PrNH_2)_n$. Heat resistance and durability of the reflective film are shown in Table 1 below.

Example 5

The procedure of Example 5 is conducted according to the same manner as in the above Example 1, except that palladium(II)acetate and titanium(IV)isopropoxide are used respectively instead of $AuCN-(PrNH_2)_n$ and copper(II)2-ethylhexanoate. Heat resistance and durability of the reflective film are shown in Table 1 below.

Example 6

The procedure of Example 6 is conducted according to the same manner as in the above Example 1, except that dicarbonylcyclopentadienyl-ruthenium(II) dimmer and $AuCN^-(PrNH_2)_n$ are used instead of $AuCN^-(NH_2Pr)_n$ and copper(II) 2-ethylhexanoate. Heat resistance and durability of the reflective film are shown in Table 1 below.

Example 7

The procedure of Example 7 is conducted according to the same manner as in the above Example 1, except that dicarbonylcyclopentadienyl-ruthenium(II) dimmer is used instead of $AuCN^-(PrNH_2)_n$. Heat resistance and durability of the reflective film are shown in Table 1 below.

Example 8

The procedure of Example 8 is conducted according to the same manner as in the above Example 1, except that dicarbonylcyclopentadienyl-ruthenium(III) dimmer and titanium (IV)isopropoxide are used instead of $AuCN^-(PrNH_2)_n$ and copper(II)2-ethylhexanoate. Heat resistance and durability of the reflective film are shown in Table 1 below.

Comparative Example 1

In a $10E^{-6}$~$10E^{-10}$ Torr vacuum chamber, into which Ar gas is flowing to a pressure of 3 mTorr, vapor deposition of Ag by sputtering method is performed until Ag film having thickness of 300 nm is obtained while maintaining a temperature of the substrate at 50° C. Heat resistance and durability of the reflective film are measured according to the same manner as in the above Example 1, and the results are shown in Table 1 below.

Comparative Example 2

6.42 g (3.0 mol) of Ag(NH$_2$Pr)$_n$(NO$_2$) is dissolved in 5.4 ml of acetonitrile to afford a coating solution. This coating solution is then applied to a glass substrate by spin coating. The resulting coating film is exposed to light using Oriel 200 W UV exposure system for 10 minutes. Thereafter, the exposed coating film is developed with acetonitrile and reduced by immersing in 0.05M hydrazine solution to afford a substantially pure metal alloy film. Subsequently, the procedure of spin coating through reduction is repeated twice to afford a 3-layer metal alloy film. This 3-layer film is annealed at 200° C. in vacuum to afford a final metallic reflective film. Heat resistance and durability of the reflective film are measured according to the same manner as in the above Example 1, and the results are shown in Table 1 below.

Example 9

6.42 g (3.0 mol) of Ag(NH$_2$Pr)$_n$(NO$_2$), 0.0013 g (0.0006 mol) of AuCN$^-$(PrNH$_2$)$_n$ and 0.0021 g (0.0006 mol) of copper(III)2-ethylhexanoate are dissolved in 5.4 ml of acetonitrile to provide a coating solution. This coating solution is then applied to a glass substrate by spin coating. The resulting coating film is exposed to light using an Oriel 200 W UV exposure system for 10 minutes. Thereafter, the exposed coating film is developed with acetonitrile and reduced by immersing in 0.05M hydrazine solution to afford a substantially pure metal alloy film. Subsequently, the procedure of spin coating through reduction is repeated twice to afford a 3-layer metal alloy film. This 3-layer film is annealed at 200° C. in a vacuum to produce a final metallic reflective film. Adhesiveness, specific resistance and reflectivity of the reflective film are measured by 3M scotch tape test, 4 point probe test and nano spectrometer, respectively. The results are shown in Table 2 in comparison with those of the Ag reflective films obtained from Comparative examples 1 and 2.

TABLE 1

| No. | Metal (alloy) film (forming method) | Used organometallic compound | | | Initial R.I.* (480 nm) Decrease of R.I. (%) | Initial R.I.* (633 nm) Decrease of R.I. (%) | Initial R.I.* (700 nm) Decrease of R.I. (%) |
|---|---|---|---|---|---|---|---|
| Comp. Ex. 1 | Ag(sputtering) | Ag | | | 245<br>60.4 | 287<br>46.8 | 296<br>42.3 |
| Comp. Ex. 2 | Ag(SOM**) | AgNO$_2^-$(PrNH$_2$)$_n$ | | | 211<br>80.4 | 270<br>77.8 | 283<br>75.9 |
| Ex. 1 | AgAuCu(SOM) | AgNO$_2^-$(PrNH$_2$)$_n$ | Au(CN)(PrNH$_2$)$_n$ | [CH$_3$(CH$_2$)$_3$CH(C$_2$H$_5$)CO$_2$]$_2$Cu | 212<br>13.1 | 269<br>8.5 | 281<br>7.4 |
| Ex. 2 | AgAuPd(SOM) | AgNO$_2^-$(PrNH$_2$)$_n$ | Au(CN)(PrNH$_2$)$_n$ | (CH$_3$CO$_2$)$_2$Pd | 203<br>32.8 | 267<br>35.2 | 279<br>34.9 |
| Ex. 3 | AgAuTi(SOM) | AgNO$_2^-$(PrNH$_2$)$_n$ | Au(CN)(PrNH$_2$)$_n$ | Ti[OCH(CH$_3$)$_2$]$_4$ | 90<br>21.8 | 152<br>29.8 | 161<br>29.4 |
| Ex. 4 | AgPdCu(SOM) | AgNO$_2^-$(PrNH$_2$)$_n$ | (CH$_3$CO$_2$)$_2$Pd | [CH$_3$(CH$_2$)$_3$CH(C$_2$H$_5$)CO$_2$]$_2$Cu | 191<br>8.7 | 257<br>16.9 | 272<br>16.4 |
| Ex. 5 | AgPdTi(SOM) | AgNO$_2^-$(PrNH$_2$)$_n$ | (CH$_3$CO$_2$)$_2$Pd | Ti[OCH(CH$_3$)$_2$]$_4$ | 162<br>38.5 | 236<br>40.6 | 256<br>40.8 |
| Ex. 6 | AgRuAu(SOM) | AgNO$_2^-$(PrNH$_2$)$_n$ | [C$_5$H$_5$Ru(CO)$_2$]$_2$ | Au(CN)(PrNH$_2$)$_n$ | 167<br>19.0 | 258<br>29.4 | 272<br>29.4 |
| Ex. 7 | AgRuCu(SOM) | AgNO$_2^-$(PrNH$_2$)$_n$ | [C$_5$H$_5$Ru(CO)$_2$]$_2$ | [CH$_3$(CH$_2$)$_3$CH(C$_2$H$_5$)CO$_2$]$_2$Cu | 198<br>1.9 | 261<br>13.5 | 275<br>13.9 |
| Ex. 8 | AgRuTi(SOM) | AgNO$_2^-$(PrNH$_2$)$_n$ | [C$_5$H$_5$Ru(CO)2]2 | Ti[OCH(CH$_3$)$_2$]$_4$ | 148<br>4.3 | 249<br>21.6 | 268<br>22.9 |

*R.I.: reflective index
**SOM: spin on metal

As shown in Table 1, although the initial reflectivity of the Ag reflective film obtained through sputtering according to Comparative example 1 is relatively high, decrease of reflectivity in the pressure cooking test is considerable, implying its poor heat-resistance and durability. Similarly, the Ag reflective film obtained through photoreaction according to Comparative example 2 exhibits high initial reflectivity, but the reflectivity significantly decreases in the pressure cooking test, implying that it is inferior to the inventive reflective films in terms of heat resistance and durability.

These results verify that the reflective films prepared by the use of the inventive composition of organometallic compounds have high reflectivity at short wavelength as well as long wavelength and that they are so excellent in heat resistance, durability and chemical stability that they can stand well against high temperature and moisture.

TABLE 2

| No. | Metal (alloy) film | Adhesiveness (%) | Specific resistance (μΩ · cm) | Reflective index (700 nm) |
|---|---|---|---|---|
| Comp. Ex. 1 | Ag(sputter) | 100 | 2.2 | 296 |
| Comp. Ex. 2 | Ag(SOM) | 40~50 | 7 | 283 |
| Ex. 9 | AgAuCu(SOM) | 120 | 15 | 281 |

As shown in Table 2, the reflective film made from the inventive composition of organometallic compounds is highly improved in adhesiveness, while the decrease in specific resistance and reflectivity is immaterial.

As stated above, by virtue of the present invention, silver alloy patterns can be obtained through a simplified manufacturing process, which patterns have enhanced heat resistance, adhesiveness and chemical stability. The inventive method may be applied to making a reflective film for LCD and metal wiring (gate, source, drain electrode) for flexible displays or flat panel displays, and further to CMP-free damascene processing and PR-free ITO film deposition.

Simple modifications and changes of the present invention by persons skilled in the art are considered to be encompassed by the scope of the present invention.

What is claimed is:

1. A method of forming a pattern of a metal alloy or oxide thereof, the method comprising:
   (i) dissolving an organometallic composition in an organic solvent to produce a coating solution;
   (ii) coating a substrate with the coating solution to form a coating film;
   (iii) exposing the coating film to a light source under a photomask having a desired pattern; and
   (iv) developing the exposed film,
   wherein the organometallic composition includes an organometallic compound (I) of Formula 1 containing Ag, an organometallic compound (II) of Formula 2 containing at least one of Au, Pd, and Ru, and an organometallic compound (III) of Formula 3 containing at least one of Ti, Ta, Cr, Mo, Ru, Ni, Pd, Cu, Au, and Al, wherein the metal components of organometallic compounds (II) and (III), respectively, are present in an amount of 0.01-10 mol % based on the mole amount of Ag in the organometallic compound (I):

$$Ag_m L_n X_p \quad \text{Formula 1}$$

wherein,

L is a neutral metallic ligand, which comprises 1~20 carbon atoms and a donor selected from the group consisting of N, O, S, and As;

X is an anion selected from the group consisting of F$^-$, Cl$^-$, Br$^-$, I$^-$, alkoxide, hydroxy, cyano(CN$^-$), nitro(NO$_2^-$), nitrate(NO$_3^-$), nitroxyl, azide, thiocyanate, isothiocyanate, tetraalkylborate, tetrahaloborate, hexafluorophosphate(PF$_6^-$), triflate(CF$_3$SO$_3^-$), tosylate(Ts$^-$), sulfate(SO$_4^{2-}$), carbonate(CO$_3^{2-}$), carboxylate, diketonate, and alkyl anion;

m is an integer from 1 to 10;

n is an integer from 1 to 40, provided that each L is the same or different in the case where n is 2 or higher, and provided that L functions as a ligand connecting Ag atoms in the case where m is 2 or higher;

p is an integer from 0 to 40, provided that each X is the same or different in case that p is 2 or higher;

$$M'_m L'_n X'_{p'} \quad \text{Formula 2}$$

wherein,

M' is Au, Pd, or Ru;

L' is a neutral ligand comprising 1~20 carbon atoms, which is selected from the group consisting of amine compounds, phosphine compounds, phosphite compounds, phosphineoxide compounds, arsine compounds, thiol compounds, carbonyl compounds, alkenes, alkynes, and arene;

X' is an anion selected from the group consisting of, F$^-$, Cl$^-$, Br$^-$, I$^-$, alkoxide, hydroxy, cyano(CN$^-$), nitro(NO$_2^-$), nitrate(NO$_3^-$), nitroxyl, azide, thiocyanate, isothiocyanate, tetraalkylborate, tetrahaloborate, hexafluorophosphate(PF$_6^-$), triflate(CF$_3$SO$_3^-$), tosylate(Ts$^-$), sulfate(SO$_4^{2-}$), carbonate(CO$_3^{2-}$), carboxylate, diketonate, and alkyl anion;

m' is an integer from 1 to 10;

n' is an integer from 1 to 40, provided that each L' is the same or different in the case where n' is 2 or higher, and provided that L' functions as a ligand connecting metal atoms in the case where m' is 2 or higher;

p' is an integer from 0 to 40, provided that each X' is the same or different in the case where p' is 2 or higher; and $$M''_m\text{-}L''_n\text{-}X''_p\text{—} \quad \text{Formula 3}$$

wherein,

M'' is Ti, Ta, Cr, Mo, Ru (provided that M' in Formula 2 is not Ru), Ni, Pd (provided that M' in Formula 2 is not Pd), Cu, Au (provided that M' in Formula 2 is not Au) or Al;

L'' is a neutral ligand comprising 1~20 carbon atoms, which is selected from the group consisting of amine compounds, phosphine compounds, phosphite compounds, phosphineoxide compounds, arsine compounds, thiol compounds, carbonyl compounds, alkenes, alkynes, and arenes;

X'' is an anion selected from the group consisting of F$^-$, Cl$^-$, Br$^-$, I$^-$, alkoxide, hydroxy, cyano(CN$^-$), nitro (NO$_2^-$), nitrate(NO$_3^-$), nitroxyl, azide, thiocyanate, isothiocyanate, tetraalkylborate, tetrahaloborate, hexafluorophosphate(PF$_6^-$), triflate(CF$_3$SO$_3^-$), tosylate (Ts$^-$), sulfate(SO$_4^{2-}$), carbonate(CO$_3^{2-}$), carboxylate, diketonate, and alkyl anion;

m'' is an integer from 1 to 10;

n'' is an integer from 1 to 40, provided that each L'' is the same or different in the case where n'' is 2 or higher, and provided that L'' functions as a ligand connecting metal atoms in the case where m'' is 2 or higher; and p'' is an integer from 0 to 40, provided that each X'' is the same or different in the case where p'' is 2 or higher.

2. The method according to claim 1, wherein the coating in step (ii) is accomplished by spin coating, roll coating, dip coating, spray coating, flow coating, or screen printing.

3. The method according to claim 1, wherein the organic solvent in step (i) is selected from the group consisting of a nitrile-based solvent, an aliphatic hydrocarbon solvent, an aromatic hydrocarbon solvent, a ketone-based solvent, an ether-based solvent, an acetate-based solvent, an alcohol-based solvent, a silicon-based solvent, and mixtures thereof.

4. The method according to claim 1, wherein the light source in step (iii) is UV light.

5. The method according to claim 1, wherein the steps (iii) and (iv) are accomplished in a vacuum or in an atmosphere of air, O$_2$, H$_2$, N$_2$, Ar, or a mixed gas thereof.

6. The method according to claim 1, further comprising the step of reduction or oxidation.

7. The method according to claim 6, further comprising the step of annealing.

8. The method according to claim 7, wherein the annealing is accomplished at a temperature of 300° C. or lower in a vacuum or in an atmosphere of air, N$_2$ gas, or a N$_2$/H$_2$ mixed gas.

9. The method according to claim 1, further comprising the step of annealing.

10. The method according to claim 9, wherein the annealing is accomplished at a temperature of 300° C. or lower in a vacuum or in an atmosphere of air, N$_2$ gas, or a N$_2$/H$_2$ mixed gas.

11. The method according to claim 1, wherein the steps (ii) through (iv) are repeated at least twice to produce a multilayer pattern of the metal alloy or oxide thereof.

* * * * *